(12) United States Patent
Kan

(10) Patent No.: US 10,975,301 B2
(45) Date of Patent: Apr. 13, 2021

(54) METHOD FOR SYNTHESIZING CORE SHELL NANOCRYSTALS AT HIGH TEMPERATURES

(71) Applicant: NANOSYS, Inc., Milpitas, CA (US)

(72) Inventor: Shihai Kan, San Jose, CA (US)

(73) Assignee: Nanosys, Inc., Milpitas, CA (US)

(*) Notice: Subject to any disclaimer, the term of this patent is extended or adjusted under 35 U.S.C. 154(b) by 0 days.

(21) Appl. No.: 16/780,250

(22) Filed: Feb. 3, 2020

(65) Prior Publication Data

US 2020/0318008 A1 Oct. 8, 2020

Related U.S. Application Data

(63) Continuation of application No. 15/615,565, filed on Jun. 6, 2017, now Pat. No. 10,550,325.

(60) Provisional application No. 62/346,127, filed on Jun. 6, 2016.

(51) Int. Cl.
*C09K 11/88* (2006.01)
*C30B 7/14* (2006.01)
*C30B 29/48* (2006.01)
*B82Y 20/00* (2011.01)
*B82Y 40/00* (2011.01)

(52) U.S. Cl.
CPC .............. *C09K 11/883* (2013.01); *C30B 7/14* (2013.01); *C30B 29/48* (2013.01); *B82Y 20/00* (2013.01); *B82Y 40/00* (2013.01); *Y10S 977/774* (2013.01); *Y10S 977/818* (2013.01); *Y10S 977/824* (2013.01); *Y10S 977/892* (2013.01); *Y10S 977/896* (2013.01); *Y10S 977/95* (2013.01)

(58) Field of Classification Search
CPC ........ C09K 11/883; B82Y 20/00; B82Y 30/00; B82Y 40/00; Y10S 977/813; Y10S 977/818; Y10S 977/819; Y10S 977/824
See application file for complete search history.

(56) References Cited

U.S. PATENT DOCUMENTS

| | | | |
|---|---|---|---|
| 5,505,928 A | 4/1996 | Alivisatos et al. |
| 6,207,229 B1 | 3/2001 | Bawendi et al. |
| 6,225,198 B1 | 5/2001 | Alivisatos et al. |
| 6,306,736 B1 | 10/2001 | Alivisatos et al. |
| 6,322,901 B1 | 11/2001 | Bawendi et al. |

(Continued)

FOREIGN PATENT DOCUMENTS

| | | |
|---|---|---|
| CN | 101275077 A | 10/2008 |
| CN | 103184045 A | 7/2013 |
| CN | 103998656 A | 8/2014 |

OTHER PUBLICATIONS

Battaglia, D. and Peng, X., "Formation of High Quality InP and InAs Nanocrystals in a Noncoordinating Solvent," *Nano Letters* 2(9):1027-1030, American Chemical Society, United States (2002).

(Continued)

*Primary Examiner* — C Melissa Koslow
(74) *Attorney, Agent, or Firm* — Sterne, Kessler, Goldstein & Fox P.L.L.C.

(57) ABSTRACT

The invention is in the field of nanostructure synthesis. The invention relates to methods for producing nanostructures, particularly Group III-V and Group II-VI semiconductor nanostructures. The invention also relates to high temperature methods of synthesizing nanostructures comprising simultaneous injection of cores and shell precursors.

5 Claims, 1 Drawing Sheet

(56) References Cited

U.S. PATENT DOCUMENTS

| | | | |
|---|---|---|---|
| 6,501,091 B1 | 12/2002 | Bawendi et al. | |
| 6,576,291 B2 | 6/2003 | Bawendi et al. | |
| 6,607,829 B1 | 8/2003 | Bawendi et al. | |
| 6,788,453 B2 | 9/2004 | Banin et al. | |
| 6,803,719 B1 | 10/2004 | Miller et al. | |
| 6,821,337 B2 | 11/2004 | Bawendi et al. | |
| 6,861,155 B2 | 3/2005 | Bawendi et al. | |
| 7,060,243 B2 | 6/2006 | Bawendi et al. | |
| 7,068,898 B2 | 6/2006 | Buretea et al. | |
| 7,125,605 B2 | 10/2006 | Bawendi et al. | |
| 7,138,098 B2 | 11/2006 | Bawendi et al. | |
| 7,374,807 B2 | 5/2008 | Parce et al. | |
| 7,374,824 B2 | 5/2008 | Bawendi et al. | |
| 7,534,488 B2 * | 5/2009 | Alivisatos | B82Y 15/00 428/402 |
| 7,557,028 B1 | 7/2009 | Scher et al. | |
| 7,566,476 B2 | 7/2009 | Bawendi et al. | |
| 7,572,395 B2 | 8/2009 | Whiteford et al. | |
| 7,645,397 B2 | 1/2010 | Parce et al. | |
| 7,867,556 B2 * | 1/2011 | Pickett | B82Y 30/00 427/214 |
| 8,062,967 B1 | 11/2011 | Scher et al. | |
| 8,101,234 B2 | 1/2012 | Bawendi et al. | |
| 8,143,703 B2 | 3/2012 | Heald et al. | |
| 8,158,193 B2 | 4/2012 | Bawendi et al. | |
| 8,282,412 B1 | 10/2012 | Yaguchi et al. | |
| 8,425,803 B2 | 4/2013 | Parce et al. | |
| 8,513,624 B2 * | 8/2013 | Choi | B82Y 15/00 250/459.1 |
| 8,563,133 B2 | 10/2013 | Whiteford et al. | |
| 8,679,543 B2 * | 3/2014 | Bartel | C01B 25/082 424/489 |
| 8,916,064 B2 | 12/2014 | Liu et al. | |
| 8,980,133 B2 * | 3/2015 | Ramprasad | H01L 33/0029 252/301.6 S |
| 9,005,480 B2 | 4/2015 | Furuta et al. | |
| 9,139,770 B2 | 9/2015 | Freeman et al. | |
| 9,169,435 B2 | 10/2015 | Guo et al. | |
| 9,202,867 B2 * | 12/2015 | Yan | B82Y 10/00 |
| 9,493,351 B2 | 11/2016 | Zhong et al. | |
| 2007/0034833 A1 | 2/2007 | Parce et al. | |
| 2008/0118755 A1 | 5/2008 | Whiteford et al. | |
| 2008/0237540 A1 | 10/2008 | Dubrow | |
| 2008/0305334 A1 | 12/2008 | Jang et al. | |
| 2010/0110728 A1 | 5/2010 | Dubrow et al. | |
| 2010/0155749 A1 | 6/2010 | Chen et al. | |
| 2010/0276638 A1 | 11/2010 | Liu et al. | |
| 2011/0262752 A1 | 10/2011 | Bawendi et al. | |
| 2011/0263062 A1 | 10/2011 | Bawendi et al. | |
| 2012/0113672 A1 | 5/2012 | Dubrow et al. | |
| 2012/0205586 A1 * | 8/2012 | Ren | C01B 25/08 252/301.36 |
| 2015/0171268 A1 | 6/2015 | Breen et al. | |
| 2015/0236195 A1 | 8/2015 | Guo et al. | |

OTHER PUBLICATIONS

Borchert, H., et al., "Investigation of ZnS Passivated InP Nanocrystals by XPS," *Nano Letters* 2(2):151-154, American Chemical Society, United States (2002).

Cros-Gagneux, A., et al., "Surface Chemistry of InP Quantum Dots: A Comprehensive Study," *J. Am. Chem. Soc.* 132:18147-18157, American Chemical Society, United States (2010).

Guzelian, A.A., et al., "Colloidal chemical synthesis and characterization of InAs nanocrystal quantum dots," *Appl. Phys. Lett.* 69(10):1432-1434, American Institute of Physics, United States (1996).

Guzelian, A.A., et al, "Synthesis of Size-Selected, Surface-Passivated InP Nanocrystals," *J. Phys. Chem.* 100:7212-7219, American Chemical Society, United States (1996).

Haubold, S., et al., "Strongly Luminescent InP/ZnS Core-Shell Nanoparticles," *ChemPhysChem* 5:331-334, Wiley-VCH-Verlag GmbH, Germany (2001).

Hussain, S., et al, "One-Pot Fabrication of High-Quality InP/ZnS (Core/Shell) Quantum Dots and Their Application to Cellular Imaging," *ChemPhysChem* 10:1466-1470, Wiley-VCH Verlag GmbH, Germany (2009).

Jin, X., et al., "Shape Control of CdTe Nanocrystals: Influence of the Solvent Composition and Ligand Effects," *Journal of Nanoparticles* vol. 2013, Article ID 243831, Hindawi Publishing Corporation, 7 pages (2013).

Jo, J.-H., et al., "Photostability enhancement of InP/ZnS quantum dots enabled by $In_2O_3$ overcoating," *Journal of Alloys and Compounds* 647:6-13, Elsevier B.V., Netherlands (2015).

Kim, S., et al., "Highly Luminescent InP/GaP/ZnS Nanocrystals and Their Application to White Light-Emitting Diodes," *J. Am. Chem. Soc.* 134:3804-3809, American Chemical Society, United States (2012).

Kwon, S.G., et al., "Kinetics of Monodisperse Iron Oxide Nanocrystal Formation by "Heating-Up" Process," *J. Am. Chem. Soc.* 129:12571-12584, American Chemical Society, United States (2007).

Li, L., et al. "Economic Synthesis of High Quality InP Nanocrystals Using Calcium Phosphide as the Phosphorus Precursor," *Chem. Mater.* 20:2621-2623, American Chemical Society, United States (2008).

Li, L. and Reiss, P., "One-pot Synthesis of Highly Luminescent InP/ZnS Nanocrystals without Precursor Injection," *J. Am. Chem. Soc.* 130:11588-11589, American Chemical Society, United States (2008).

Lim, J., et al., "InP@ZnSeS, Core@Composition Gradient Shell Quantum Dots with Enhanced Stability," *Chemistry of Materials* 23:4459-4463, American Chemical Society, United States (2011).

Liu, Z., et al., "Coreduction Colloidal Synthesis of III-V Nanocrystals: The Case of InP," *Angew. Chem. Int. Ed.* 47:3540-3542, Wiley-VCH Verlag GmbH & Co, Germany (2008).

Lucey, D.W., et al., "Monodispersed InP Quantum Dots Prepared by Colloidal Chemistry in a Noncoordinating Solvent," *Chem. Mater.* 17:3754-3762, American Chemical Society, United States (2005).

Mićić, O. I., et al., "Size-Dependent Spectroscopy of InP Quantum Dots," *J. Phys. Chem. B* 101:4904-4912, American Chemical Society, United States (1997).

Mićić, O. I., et al., "Core-Shell Quantum Dots of Lattice-Matched $ZnCdSe_2$ Shells on InP Cores: Experiment and Theory," *J. Phys. Chem. B* 104:12149-12156, American Chemical Society, United States (2000).

Murray, C.B., et al., "Synthesis and Characterization of Nearly Monodisperse CdE (E = S, Se, Te) Semiconductor Nanocrystallites," *J. Am. Chem. Soc.* 115:8706-8715, American Chemical Society, United States (1993).

Mushonga, P., et al., "Indium Phosphide-Based Semiconductor Nanocrystals and Their Applications," *Journal of Nanomaterials* vol. 2012, Article ID 869284, Hindawi Publishing Corporation, 11 pages (2012).

Nann, T., et al., "Water Splitting by Visible Light: A Nanophotocathode for Hydrogen Production," *Angew. Chem. Int. Ed.* 49:1574-1577, Wiley-VCH Verlag GmbH & Co., Germany (2010).

Wang, A., et al., "Bright, efficient, and color-stable violet ZnSe-based quantum dot light-emitting diodes," *Nanoscale* 7:2951-2959, The Royal Society of Chemistry, United Kingdom (2015).

Wells, R.L., et al., "Use of Tris(trimethylsilyl)arsine to Prepare Gallium Arsenide and Indium Arsenide," *Chemistry of Materials* 1(1):4-6, American Chemical Society, United States (1989).

Xie, R., et al., "Colloidal InP Nanocrystals as Efficient Emitters Covering Blue to Near-Infrared," *J. Am. Chem. Soc.* 129:15432-15433, American Chemical Society, United States (2007).

Xu, S., et al., "Rapid Synthesis of High-Quality InP Nanoclystals," *J. Am. Chem. Soc.* 128:1054-1055, American Chemical Society, United States (2006).

Zan, F., et al., "Experimental Studies on Blinking Behavior of Single InP/ZnS Quantum Dots: Effects of Synthetic Conditions and UV Irradiation," *J. Phys. Chem. C* 116:3944-3950, American Chemical Society, United States (2012).

International Search Report and Written Opinion for International Application No. PCT/US2017/036100, European Patent Office, Netherlands, dated Sep. 19, 2017, 12 pages.

(56) References Cited

OTHER PUBLICATIONS

Protière, M. and Reiss, P., "Highly Luminescent $Cd_{1-x}Zn_xSe/ZnS$ Core/Shell Nanoclystals Emitting in the Blue-Green Spectral Range," *Small* 3(3):399-403, Wiley-VCH, Germany (2007).
Yang, J., et al., "Tunable luminescence of spherical CdSe/ZnS and tetrahedron $CdSe/Cd_{1-x}Zn_xS$ core/shell quantum dots created using same cores," *Materials Chemistry and Physics* 135(2-3):486-492, Elsevier B.V., Netherlands (2012).

\* cited by examiner

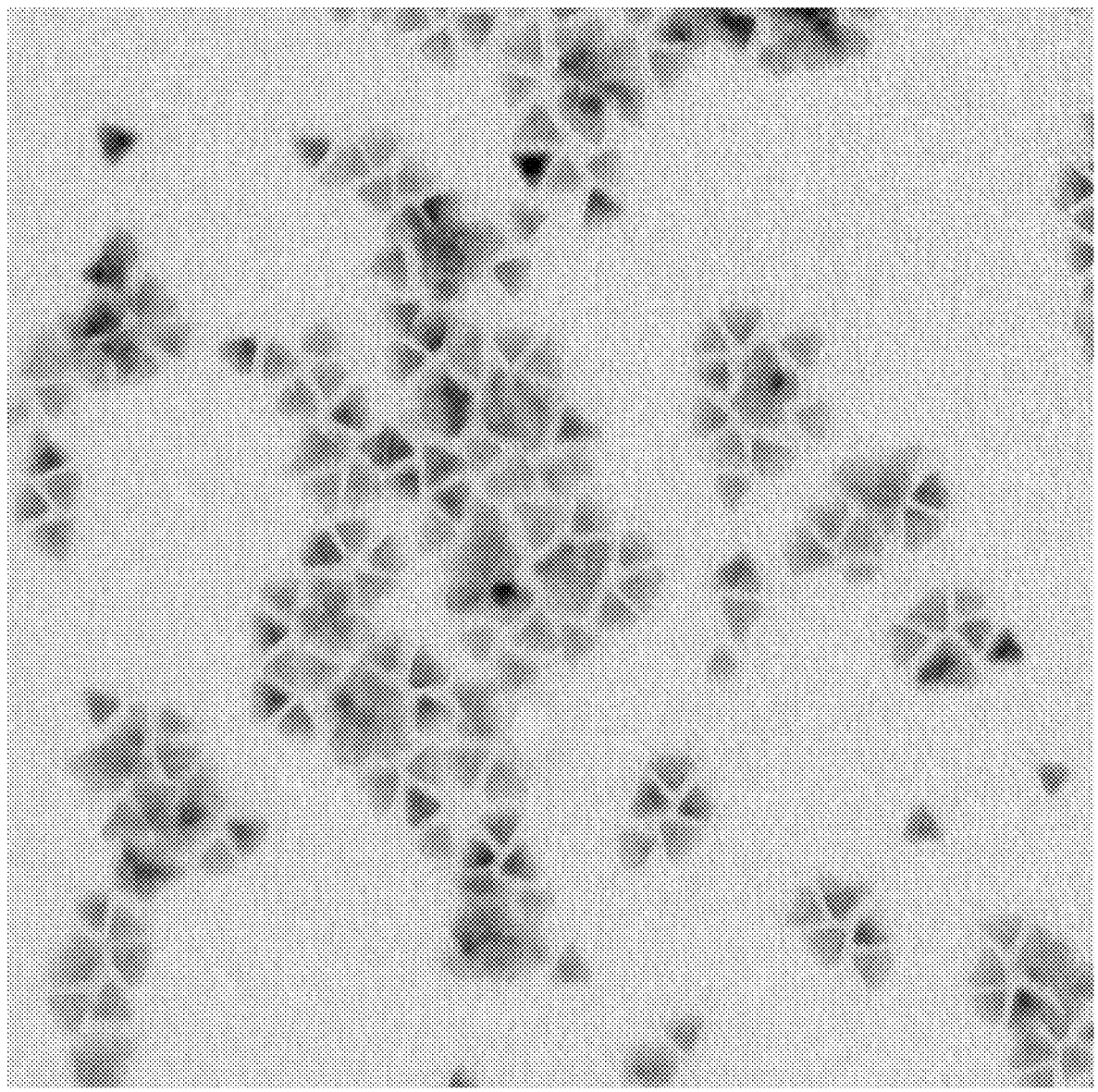

METHOD FOR SYNTHESIZING CORE SHELL NANOCRYSTALS AT HIGH TEMPERATURES

FIELD OF THE INVENTION

The invention is in the field of nanostructure synthesis. The invention relates to methods for producing nanostructures, particularly Group III-V and Group II-VI semiconductor nanostructures. The invention also relates to high temperature methods of synthesizing nanostructures comprising simultaneous injection of cores and shell precursors.

BACKGROUND OF THE INVENTION

Semiconductor nanostructures can be incorporated into a variety of electronic and optical devices. The electrical and optical properties of such nanostructures vary, e.g., depending on their composition, shape, and size. For example, size-tunable properties of semiconductor nanoparticles are of great interest for applications such as light emitting diodes (LEDs), lasers, and biomedical labeling. Highly luminescent nanostructures are particularly desirable for such applications.

To exploit the full potential of nanostructures in applications such as LEDs and displays, the nanostructures need to simultaneously meet five criteria: narrow and symmetric emission spectra, high photoluminescence (PL) quantum yields (QYs), high optical stability, eco-friendly materials, and low-cost methods for mass production. Most previous studies on highly emissive and color-tunable quantum dots have concentrated on materials containing cadmium, mercury, or lead. Wang, A., et al., *Nanoscale* 7:2951-2959 (2015). But, there are increasing concerns that toxic materials such as cadmium, mercury, or lead would pose serious threats to human health and the environment and the European Union's Restriction of Hazardous Substances rules ban any consumer electronics containing more than trace amounts of these materials. Therefore, there is a need to produce materials that are free of cadmium, mercury, and lead for the production of LEDs and displays.

There are two main techniques that have been successful used for the synthesis of CdSe nanocrystals: (1) the hot-injection technique and (2) the heating-up technique. Mushonga, P., et al., *J. Nanomaterials* 2012:Article ID 869284 (2012).

The hot-injection technique involves the rapid injection of a solution of precursors at room temperature into a hot reaction medium in the presence of carefully chosen surfactant molecules. Rapidly injecting the solution of precursors induces a sudden supersaturation and results in a short burst of nucleation. The depletion of reagents through nucleation and the sudden temperature drop associated with the introduction of room temperature reagents results in a decrease in nucleation and an increase in growth of nanocrystals. It is the sequential separation of the nucleation and growth phases that leads to precise control of the size and shape of the resultant nanocrystals. Murray, C. B., et al., *J. Am. Chem. Soc.* 115:8706-8715 (1993) describes the synthesis of nearly monodisperse CdSe nanocrystals by injection of a room temperature solution combining $Me_2Cd$ in trioctylphosphine (TOP) and trioctylphosphine selenide (TOPSe) into a 300° C. solution of tri-n-octylphosphine oxide (TOPO). After the temperature dropped, the reaction mixture was slowly heated to 230-260° C. which allowed for slow growth and annealing of the crystals. Murray at 8708.

The hot-injection technique was also used to synthesize CdTe nanocrystals using a mixture of oleylamine and octadecene as the solvent. Jin, X., et al., *J. Nanoparticles* 2013:Article ID 243831 (2013). Jin describes preparation of a Te precursor solution which was quickly injected into a Cd precursor solution heated to 300° C. at a weight ratio of Cd to Te of 10:7. Jin found that various shapes of CdTe nanocrystals could be obtained by changing the reaction conditions—e.g., the composition of the solvent.

The heating-up technique is a batch process in which all the precursors are mixed at room temperature followed by a rapid heating of the system to the appropriate growth temperature for the nanocrystals. Mushonga, P., et al., *J. Nanomaterials* 2012:Article ID 869284 (2012). The heating-up technique allows the supersaturation level and the temperature of the solution to increase together and the nucleation rate is sensitive to both. This technique was found to be easily scaled up and reproducible. Kwon, S. G., et al., *J. Am. Chem. Soc.* 129:12571-12584 (2007).

In the traditional synthesis of core-shell nanocrystals, cores and ligands are blended in a reactor and heated to the shell growth temperature, and then shell precursors are introduced to the blend to initiate shell growth. During the heat-up, the tiny cores may endure unwanted size, morphology, and/or compositional changes, especially when the desired shell growth temperature is high, in order to encourage reaction of precursors with low reactivity. The issue is more serious when the desired shell growth temperatures are high. To avoid this problem, a temperature ramp-up approach is commonly adopted, in which shell precursors are added while the reaction temperature is ramped up from a low starting temperature to a higher temperature. This approach often results in secondary nucleation issues because at low temperatures, the shell precursors react incompletely and begin to accumulate. Secondary nucleation is nucleation which occurs, irrespective of the mechanism, only because of the presence of crystals of the material being crystallized—no secondary nucleation will occur if no crystals are present. With the temperature increasing and the precursor concentration building up, undesirable secondary nucleation often occurs.

The present invention provides an improved method for the synthesis of nanocrystals. In each increment of the core-precursor mixture introduced into the hot solvent mixture, the core-to-precursor ratio is constant and the precursor concentration is sufficiently low due to the immediate dilution by the solvent mixture. These, along with the high temperature of the reaction mixture, ensure that the shell precursors are consumed rapidly and there is no build-up of precursors before the next increment of core-precursor blend is introduced. Therefore, the opportunity for secondary nucleation is low. The shell precursors will also be equally distributed to each core because of the low precursor concentration, making shell thickness on each core roughly equal. Once a shell is deposited on the cores, the particles become thermodynamically more stable, thus the freshly introduced shell precursors tend to grow on the freshly introduced, thermodynamically more unstable cores. Thus, the cores that arrived earlier do not compete with the newly arrived cores for precursors. This ensures homogeneous shell growth.

SUMMARY OF THE INVENTION

The present invention provides a method of producing a nanostructure comprising:
(a) introducing a solution comprising at least one first shell precursor;
(b) raising the temperature of the solution obtained in (a); and
(c) simultaneously adding at least one second shell precursor and a nanocrystal core to the solution of (a), wherein at least one of the second shell precursors in (c) is different from the first shell precursor in (a);
to provide a nanostructure.

In some embodiments, the nanocrystal core is a InP, InZnP, InGaP, CdSe, CdS, CdSSe, CdZnSe, CdZnS, ZnSe, ZnSSe, InAs, InGaAs, or InAsP nanocrystal. In some embodiments, the nanocrystal core is a InP nanocrystal.

In some embodiments, the at least one first shell precursor is a zinc source or a cadmium source.

In some embodiments, the zinc source is selected from the group consisting of zinc oleate, zinc hexanoate, zinc octanoate, zinc laurate, zinc palmitate, zinc stearate, zinc dithiocarbamate, or mixtures thereof. In some embodiments, the zinc source is zinc stearate or zinc oleate.

In some embodiments, the second shell precursor is a sulfur source, a selenium source, or a tellurium source.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclophosphine selenide, cyclohexylphosphine selenide, 1-octaneselenol, 1-dodecaneselenol, selenophenol, elemental selenium, bis(trimethylsilyl) selenide, and mixtures thereof. In some embodiments, the selenium source is tri(n-butyl)phosphine selenide or trioctylphosphine selenide.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is octanethiol.

In some embodiments, the temperature in (b) is raised to between about 280° C. and 350° C. In some embodiments, the temperature in (b) is raised to between about 280° C. and about 350° C. In some embodiments, the temperature in (b) is raised to between about 300° C. and about 330° C.

In some embodiments, the temperature in (b) is maintained for between 2 minutes and 240 minutes. In some embodiments, the temperature in (b) is maintained for between 5 minutes and 15 minutes.

In some embodiments, the solution in (a) further comprises a solvent. In some embodiments, the solvent is selected from the group consisting of 1-octadecene, 1-hexadecene, 1-eicosene, eicosane, octadecane, hexadecane, tetradecane, squalene, trioctylphosphine oxide, trioctylphosphine, and dioctyl ether. In some embodiments, the solvent is trioctylphosphine.

In some embodiments, the method of producing a nanostructure further comprises raising, lowering, or maintaining the temperature after the simultaneous addition in (c) to provide a temperature between about 250° C. and 350° C. In some embodiments, the method producing a nanostructure further comprises raising, lowering, or maintaining the temperature after the simultaneous addition in (c) to provide a temperature between about 280° C. and about 330° C.

In some embodiments, the at least one first shell precursor is a zinc source, wherein the at least one second shell precursor is a sulfur source or a selenium source, and wherein the temperature in (b) is raised to between about 280° C. and 330° C.

The present invention provides a method of producing a nanostructure comprising:
(a) introducing a solution comprising at least one first shell precursor;
(b) raising the temperature of the solution obtained in (b);
(c) simultaneously adding at least one second shell precursor and a nanocrystal core to the solution of (a), wherein at least one of the second shell precursors in (c) is different from the at least one first shell precursor in (a); and
(d) simultaneously adding at least two third shell precursors to the solution of (c), wherein at least one of the third shell precursors in (d) is different from the at least one shell precursor in (b);
to provide a nanostructure.

In some embodiments, the nanocrystal core is a InP, InZnP, InGaP, CdSe, CdS, CdSSe, CdZnSe, CdZnS, ZnSe, ZnSSe, InAs, InGaAs, or InAsP nanocrystal. In some embodiments, the nanocrystal core is a InP nanocrystal.

In some embodiments, the at least one first shell precursor is a zinc source or a cadmium source.

In some embodiments, zinc source is selected from the group consisting of zinc oleate, zinc hexanoate, zinc octanoate, zinc laurate, zinc palmitate, zinc stearate, zinc dithiocarbamate, or mixtures thereof. In some embodiments, the zinc source is zinc stearate or zinc oleate.

In some embodiments, the second shell precursor is a sulfur source, a selenium source, or a tellurium source.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclophosphine selenide, cyclohexylphosphine selenide, 1-octaneselenol, 1-dodecaneselenol, selenophenol, elemental selenium, bis(trimethylsilyl) selenide, and mixtures thereof. In some embodiments, the selenium source is tri(n-butyl)phosphine selenide or trioctylphosphine selenide.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is octanethiol.

In some embodiments, the temperature in (b) is raised to between about 200° C. and 350° C. In some embodiments, the temperature in (b) is raised to between about 280° C. and about 350° C. In some embodiments, the temperature in (b) is raised to between about 300° C. and about 330° C.

In some embodiments, the temperature in (b) is maintained for between 2 minutes and 240 minutes. In some embodiments, the temperature in (b) is maintained for between 5 minutes and 15 minutes.

In some embodiments, the solution in (a) further comprises a solvent. In some embodiments, the solvent is selected from the group consisting of 1-octadecene, 1-hexadecene, 1-eicosene, eicosane, octadecane, hexadecane, tetradecane, squalene, trioctylphosphine oxide, trioctylphosphine, and dioctyl ether. In some embodiments, the solvent is trioctylphosphine.

In some embodiments, the method of producing a nanostructure further comprises raising, lowering, or maintaining the temperature after the simultaneous addition in (c) to provide a temperature between about 250° C. and 350° C. In some embodiments, the method of producing a nanostructure further comprises raising, lowering, or maintaining the temperature after the simultaneous addition in (c) to provide a temperature between about 280° C. and about 330° C.

In some embodiments, the at least two third shell precursors in (d) are selected from the group consisting of a zinc source, a sulfur source, a selenium source, a cadmium source, and a tellurium source.

In some embodiments, the method of producing a nanostructure further comprises raising, lowering, or maintaining the temperature after the simultaneous addition in (d) to provide a temperature between about 250° C. and 350° C. In some embodiments, the method of producing a nanostructure further comprises raising, lowering, or maintaining the temperature after the simultaneous addition in (d) to provide a temperature between about 280° C. and about 330° C. In some embodiments, the method of producing a nanostructure further comprises raising, lowering, or maintaining the temperature after the simultaneous addition in (d) to provide a temperature between about 300° C. and about 330° C.

In some embodiments, the at least one first shell precursor is a zinc source, wherein the at least one second shell precursor is a selenium source, wherein the temperature in (b) is raised to between about 300° C. and about 330° C., and wherein the at least one third shell precursor is a sulfur source.

In some embodiments, the present invention provides a method for producing a nanostructure comprising:
 (a) simultaneously adding at least one first shell precursor and a nanocrystal core to a solution wherein the solution is at a temperature between 200° C. and 350° C.; and
 (b) simultaneously adding at least two second shell precursors to the solution of (a), wherein at least one of the second shell precursors in (b) is different from the first shell precursor in (a);
to provide a nanostructure.

In some embodiments, the nanocrystal core is a InP, InZnP, InGaP, CdSe, CdS, CdSSe, CdZnSe, CdZnS, ZnSe, ZnSSe, InAs, InGaAs, or InAsP nanocrystal. In some embodiments, the nanocrystal core is a InP nanocrystal.

In some embodiments, the at least one shell precursor is a sulfur source, a selenium source, or a tellurium source.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclophosphine selenide, cyclohexylphosphine selenide, 1-octaneselenol, 1-dodecaneselenol, selenophenol, elemental selenium, bis(trimethylsilyl) selenide, and mixtures thereof. In some embodiments, the selenium source is tri(n-butyl)phosphine selenide or trioctylphosphine selenide.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is octanethiol.

In some embodiments, the temperature in (a) is between about 250° C. and about 310° C.

In some embodiments, one of the at least two second shell precursors in (b) is a zinc source, a cadmium source, a sulfur source, a selenium source, or a tellurium source.

In some embodiments, the zinc source is selected from the group consisting of zinc oleate, zinc hexanoate, zinc octanoate, zinc laurate, zinc palmitate, zinc stearate, zinc dithiocarbamate, or mixtures thereof. In some embodiments, the zinc source is zinc stearate or zinc oleate.

In some embodiments, the method of producing a nanostructure further comprises raising, lowering, or maintaining the temperature after the simultaneous addition in (b) to provide a temperature between about 200° C. and 350° C. In some embodiments, the method of producing a nanostructure further comprises raising, lowering, or maintaining the temperature after the simultaneous addition in (b) to provide a temperature between about 280° C. and about 350° C. In some embodiments, the method of producing a nanostructure further comprises raising, lowering, or maintaining the temperature after the simultaneous addition in (b) to provide a temperature between about 280° C. and about 310° C.

In some embodiments, the temperature is maintained for between 2 minutes and 240 minutes. In some embodiments, the temperature is maintained for between 5 minutes and 15 minutes.

In some embodiments, the at least one first shell precursor is a selenium source, wherein the at least two second shell precursors are a zinc source and a sulfur source, and wherein the temperature in (a) is between about 280° C. and about 310° C.

The present invention provides a population of nanostructures comprising a core and at least one shell, wherein the population has a tetrahedral shape.

In some embodiments, the core of the population of nanostructures is is a InP, InZnP, InGaP, CdSe, CdS, CdSSe, CdZnSe, CdZnS, ZnSe, ZnSSe, InAs, InGaAs, or InAsP nanocrystal. In some embodiments, the core is InP.

In some embodiments, the at least one shell of the population of nanostructures comprises a mixture of at least two of a zinc source, a selenium source, and a sulfur source.

In some embodiments, the population has a FWHM of between 10 nm and 60 nm. In some embodiments, the population has a FWHM of between 10 nm and 50 nm.

BRIEF DESCRIPTION OF THE DRAWINGS

The FIGURE is a transmission electron micrograph (TEM) of a InP/ZnSe/ZnS quantum dot prepared using the method of the present invention. As shown in the TEM image, the quantum dots have a tetrahedral shape. The quantum dots also show good size distribution and do not show signs of secondary nucleation.

DETAILED DESCRIPTION OF THE INVENTION

Definitions

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by 10% of the value, or optionally ±5% of the value, or in some embodiments, by 1% of the value so described. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent planes in the (111) direction. By way of example, one monolayer of cubic ZnSe corresponds to 0.328 nm and one monolayer of cubic ZnS corresponds to 0.31 nm thickness. The thickness of a monolayer of alloyed materials can be determined from the alloy composition through Vegard's law.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from TEM images of nanocrystals before and after a shell synthesis.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

As used herein the term "simultaneous" means at the same time.

As used herein the term "near simultaneous" means within about 0 to about 30 seconds, within about 0 to about 20 seconds, within about 0 to about 10 seconds, within about 0 to about 5 seconds, within about 0 to about 1 second, within about 1 second to about 30 seconds, within about 1 second to about 20 seconds, within about 1 second to about 10 seconds, within about 1 second to about 5 seconds, within about 5 seconds to about 30 seconds, within about 5 seconds to about 20 seconds, within about 5 seconds to about 10 seconds, within about 10 seconds to about 30 seconds, within about 10 seconds to about 20 seconds, or within about 20 seconds to about 30 seconds.

"Alkyl" as used herein refers to a straight or branched, saturated, aliphatic radical having the number of carbon atoms indicated. In some embodiments, the alkyl is $C_{1-2}$ alkyl, $C_{1-3}$ alkyl, $C_{1-4}$ alkyl, $C_{1-5}$ alkyl, $C_{1-6}$ alkyl, $C_{1-7}$ alkyl, $C_{1-8}$ alkyl, $C_{1-9}$ alkyl, $C_{1-10}$ alkyl, $C_{1-12}$ alkyl, $C_{1-14}$ alkyl, $C_{1-16}$ alkyl, $C_{1-18}$ alkyl, $C_{1-20}$ alkyl, $C_{8-20}$ alkyl, $C_{12-20}$ alkyl, $C_{14-20}$ alkyl, $C_{16-20}$ alkyl, or $C_{18-20}$ alkyl. For example, $C_{1-6}$ alkyl includes, but is not limited to, methyl, ethyl, propyl, isopropyl, butyl, isobutyl, sec-butyl, tert-butyl, pentyl, isopentyl, and hexyl. In some embodiments, the alkyl is octyl, nonyl, decyl, undecyl, dodecyl, tridecyl, tetradecyl, pentadecyl, hexadecyl, heptadecyl, octadecyl, nonadecyl, or icosanyl.

Unless clearly indicated otherwise, ranges listed herein are inclusive.

A variety of additional terms are defined or otherwise characterized herein.

Production of a Core

Methods for colloidal synthesis of a variety of nanostructures are known in the art. Such methods include techniques for controlling nanostructure growth, e.g., to control the size and/or shape distribution of the resulting nanostructures.

In a typical colloidal synthesis, semiconductor nanostructures are produced by rapidly injecting precursors that undergo pyrolysis into a hot solution (e.g., hot solvent and/or surfactant). The precursors can be injected simultaneously or sequentially. The precursors rapidly react to form nuclei. Nanostructure growth occurs through monomer addition to the nuclei, typically at a growth temperature that is lower than the injection/nucleation temperature.

Ligands interact with the surface of the nanostructure. At the growth temperature, the ligands rapidly adsorb and desorb from the nanostructure surface, permitting the addition and/or removal of atoms from the nanostructure while suppressing aggregation of the growing nanostructures. In general, a ligand that coordinates weakly to the nanostructure surface permits rapid growth of the nanostructure, while a ligand that binds more strongly to the nanostructure surface results in slower nanostructure growth. The ligand can also interact with one (or more) of the precursors to slow nanostructure growth.

Nanostructure growth in the presence of a single ligand typically results in spherical nanostructures. Using a mixture of two or more ligands, however, permits growth to be controlled such that non-spherical nanostructures can be produced, if, for example, the two (or more) ligands adsorb differently to different crystallographic faces of the growing nanostructure.

A number of parameters are thus known to affect nanostructure growth and can be manipulated, independently or in combination, to control the size and/or shape distribution of the resulting nanostructures. These include, e.g., temperature (nucleation and/or growth), precursor composition, time-dependent precursor concentration, ratio of the precursors to each other, surfactant composition, number of surfactants, and ratio of surfactant(s) to each other and/or to the precursors.

The synthesis of Group II-VI nanostructures has been described in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and in U.S. Patent Appl. Publication Nos. 2011/0262752 and 2011/0263062. In some embodiments, the core is a Group II-VI nanocrystal selected from the group consisting of ZnO, ZnSe, ZnS, ZnTe, CdO, CdSe, CdS, CdTe, HgO, HgSe, HgS, and HgTe.

In some embodiments, the core is a nanocrystal selected from the group consisting of ZnSe, ZnS, CdSe, or CdS.

Although Group II-VI nanostructures such as CdSe and CdS quantum dots can exhibit desirable luminescence behavior, issues such as the toxicity of cadmium limit the applications for which such nanostructures can be used. Less toxic alternatives with favorable luminescence properties are thus highly desirable. Group III-V nanostructures in general and InP-based nanostructures in particular, offer the best known substitute for cadmium-based materials due to their compatible emission range.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, can be measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

In some embodiments, the core is a Group III-V nanostructure. In some embodiments, the core is a Group III-V nanocrystal selected from the group consisting of BN, BP, BAs, BSb, AlN, AlP, AlAs, AlSb, GaN, GaP, GaAs, GaSb, InN, InP, InAs, and InSb. In some embodiments, the core is a InP nanocrystal.

The synthesis of Group III-V nanostructures has been described in U.S. Pat. Nos. 5,505,928, 6,306,736, 6,576,291, 6,788,453, 6,821,337, 7,138,098, 7,557,028, 8,062,967, 7,645,397, and 8,282,412 and in U.S. Patent Appl. Publication No. 2015/236195. Synthesis of Group III-V nanostructures has also been described in Wells, R. L., et al., "The use of tris(trimethylsilyl)arsine to prepare gallium arsenide and indium arsenide," *Chem. Mater.* 1:4-6 (1989) and in Guzelian, A. A., et al., "Colloidal chemical synthesis and characterization of InAs nanocrystal quantum dots," *Appl. Phys. Lett.* 69: 1432-1434 (1996).

Synthesis of InP-based nanostructures has been described, e.g., in Xie, R., et al., "Colloidal InP nanocrystals as efficient emitters covering blue to near-infrared," *J. Am. Chem. Soc.* 129:15432-15433 (2007); Micic, O. I., et al., "Core-shell quantum dots of lattice-matched ZnCdSe$_2$ shells on InP cores: Experiment and theory," *J. Phys. Chem. B* 104:12149-12156 (2000); Liu, Z., et al., "Coreduction colloidal synthesis of III-V nanocrystals: The case of InP," *Angew. Chem. Int. Ed. Engl.* 47:3540-3542 (2008); Li, L. et al., "Economic synthesis of high quality InP nanocrystals using calcium phosphide as the phosphorus precursor," *Chem. Mater.* 20:2621-2623 (2008); D. Battaglia and X. Peng, "Formation of high quality InP and InAs nanocrystals in a noncoordinating solvent," *Nano Letters* 2:1027-1030 (2002); Kim, S., et al., "Highly luminescent InP/GaP/ZnS nanocrystals and their application to white light-emitting diodes," *J. Am. Chem. Soc.* 134:3804-3809 (2012); Nann, T., et al., "Water splitting by visible light: A nanophotocathode for hydrogen production," *Angew. Chem. Int. Ed.* 49:1574-1577 (2010); Borchert, H., et al., "Investigation of ZnS passivated InP nanocrystals by XPS," *Nano Letters* 2:151-154 (2002); L. Li and P. Reiss, "One-pot synthesis of highly luminescent InP/ZnS nanocrystals without precursor injection," *J. Am. Chem. Soc.* 130:11588-11589 (2008); Hussain, S., et al. "One-pot fabrication of high-quality InP/ZnS (core/shell) quantum dots and their application to cellular imaging," *Chemphyschem.* 10:1466-1470 (2009); Xu, S., et al., "Rapid synthesis of high-quality InP nanocrystals," *J. Am. Chem. Soc.* 128:1054-1055 (2006); Micic, O. I., et al., "Size-dependent spectroscopy of InP quantum dots," *J. Phys. Chem. B* 101:4904-4912 (1997); Haubold, S., et al., "Strongly luminescent InP/ZnS core-shell nanoparticles," *Chemphyschem.* 5:331-334 (2001); CrosGagneux, A., et al., "Surface chemistry of InP quantum dots: A comprehensive study," *J. Am. Chem. Soc.* 132:18147-18157 (2010); Micic, O. I., et al., "Synthesis and characterization of InP, GaP, and GaInP2 quantum dots," *J. Phys. Chem.* 99:7754-7759 (1995); Guzelian, A. A., et al., "Synthesis of size-selected, surface-passivated InP nanocrystals," *J. Phys. Chem.* 100: 7212-7219 (1996); Lucey, D. W., et al., "Monodispersed InP quantum dots prepared by colloidal chemistry in a non-coordinating solvent," *Chem. Mater.* 17:3754-3762 (2005); Lim, J., et al., "InP@ZnSeS, core@composition gradient shell quantum dots with enhanced stability," *Chem. Mater.* 23:4459-4463 (2011); and Zan, F., et al., "Experimental studies on blinking behavior of single InP/ZnS quantum dots: Effects of synthetic conditions and UV irradiation," *J. Phys. Chem. C* 116:394-3950 (2012). However, such efforts have had only limited success in producing InP nanostructures with high quantum yields.

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, CuInS$_2$, CuInSe$_2$, AlN, AlP, AlAs, GaN, GaP, or GaAs.

In some embodiments, the core is purified before deposition of a shell. In some embodiments, the core is filtered to remove precipitate from the core solution.

In some embodiments, the diameter of the core is determined using quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the bandgap remains at its original energy due to a continuous energy state. However, as the confining dimension decreases and reaches a certain limit, typically in nanoscale, the energy spectrum becomes discrete. As a result, the bandgap becomes size-dependent.

Production of a Shell

In some embodiments, the nanostructures of the present invention include a core and at least one shell. In some embodiments, the nanostructures of the present invention include a core and at least two shells. The shell can, e.g., increase the quantum yield and/or stability of the nanostructures. In some embodiments, the core and the shell comprise different materials. In some embodiments, the nanostructure comprises shells of different shell material.

In some embodiments, a shell is deposited onto a core or a core/shell(s) that comprises a mixture of Group II and VI elements. In some embodiments, the shell is a mixture of at least two of a zinc source, a selenium source, a sulfur source, a tellurium source, and a cadmium source. In some embodiments, the shell is a mixture of two of a zinc source, a selenium source, a sulfur source, a tellurium source, and a cadmium source. In some embodiments, the shell is a mixture of three of a zinc source, a selenium source, a sulfur source, a tellurium source, and a cadmium source. In some embodiments, the shell is a mixture of: zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium and zinc; cadmium, zinc, and sulfur; cadmium, zinc, and selenium; or cadmium, zinc, sulfur, and selenium.

The thickness of the shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by TEM. In some embodiments, each shell has a thickness of between 0.05 nm and 3.5 nm, between 0.05 nm and 2 nm, between 0.05 nm and 0.9 nm, between 0.05 nm and 0.7 nm, between 0.05 nm and 0.5 nm, between 0.05 nm and 0.3 nm, between 0.05 nm and 0.1 nm, between 0.1 nm and 3.5 nm, between 0.1 nm and 2 nm, between 0.1 nm and 0.9 nm, between 0.1 nm and 0.7 nm, between 0.1 nm and 0.5 nm, between 0.1 nm and 0.3 nm, between 0.3 nm and 3.5 nm, between 0.3 nm and 2 nm, between 0.3 nm and 0.9 nm, between 0.3 nm and 0.7 nm, between 0.3 nm and 0.5 nm, between 0.5 nm and 3.5 nm, between 0.5 nm and 2 nm, between 0.5 nm and 0.9 nm, between 0.5 nm and 0.7 nm, between 0.7 nm and 3.5 nm, between 0.7 nm and 2 nm, between 0.7 nm and 0.9 nm, between 0.9 nm and 3.5 nm, between 0.9 nm and 2 nm, or between 2 nm and 3.5 nm.

In some embodiments, each shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

Ligands suitable for the synthesis of a shell are known by those of skill in the art. In some embodiments, the ligand is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is oleic acid.

In some embodiments, each shell is produced in the presence of a mixture of ligands. In some embodiments, each shell is produced in the presence of a mixture comprising 2, 3, 4, 5, or 6 different ligands. In some embodiments, each shell is produced in the presence of a mixture comprising 3 different ligands.

In some embodiments, each shell is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, trioctylamine, trioctylphosphine, and dioctyl ether. In some embodiments, the solvent is 1-octadecene. In some embodiments, the solvent is trioctylphosphine.

In some embodiments, the present invention is directed to a method of producing a nanostructure comprising:
(a) introducing a solution comprising at least one first shell precursor;
(b) raising the temperature of the solution obtained in (a); and
(c) simultaneously adding at least one second shell precursor and a nanocrystal core to the solution of (a), wherein at least one of the second shell precursors in (c) is different from the first shell precursor in (a);
to provide a nanostructure.

In some embodiments, at least one shell precursor and a solvent are introduced in (a) at a temperature between 20° C. and 310° C., between 20° C. and 280° C., between 20° C. and 250° C., between 20° C. and 200° C., between 20° C. and 150° C., between 20° C. and 100° C., between 20° C. and 50° C., between 50° C. and 310° C., between 50° C. and 280° C., between 50° C. and 250° C., between 50° C. and 200° C., between 50° C. and 150° C., between 50° C. and 100° C., between 100° C. and 310° C., between 100° C. and 280° C., between 100° C. and 250° C., between 100° C. and 200° C., between 100° C. and 150° C., between 150° C. and 310° C., between 150° C. and 280° C., between 150° C. and 250° C., between 150° C. and 200° C., between 200° C. and 310° C., between 200° C. and 280° C., between 200° C. and 250° C., between 250° C. and 310° C., between 250° C. and 280° C., or between 280° C. and 310° C. In some embodiments, the shell precursor is a Group II shell precursor. In some embodiments, the shell precursor is a zinc source. In some embodiments, a Group II shell precursor and a solvent are introduced in (a) at a temperature between 20° C. and 100° C.

In some embodiments, after introducing in (a) at least one shell precursor and a solvent, the temperature of the addition mixture is raised in (b) to an elevated temperature between 200° C. and 350° C., between 200° C. and 310° C., between 200° C. and 280° C., between 200° C. and 250° C., between 200° C. and 220° C., between 220° C. and 350° C., between 220° C. and 310° C., between 220° C. and 280° C., between 220° C. and 250° C., between 250° C. and 350° C., between 250° C. and 310° C., between 250° C. and 280° C., between 280° C. and 350° C., between 280° C. and 310° C., or between 310° C. and 350° C. In some embodiments, the shell precursor is a Group II shell precursor. In some embodiments, the shell precursor is a zinc source. In some embodiments, after contacting a Group II shell precursor and a solvent, the temperature of the addition mixture is raised in (b) to between 220° C. and 310° C.

In some embodiments, after introducing in (a) at least one shell precursor and a solvent, the time for the temperature to reach the elevated temperature is between 2 minutes and 240 minutes, between 2 minutes and 200 minutes, between 2 minutes and 100 minutes, between 2 minutes and 60 minutes, between 2 minutes and 40 minutes, between 5 minutes and 240 minutes, between 5 minutes and 200 minutes, between 5 minutes and 100 minutes, between 5 minutes and 60 minutes, between 5 minutes and 40 minutes, between 10 minutes and 240 minutes, between 10 minutes and 200 minutes, between 10 minutes and 100 minutes, between 10 minutes and 60 minutes, between 10 minutes and 40 minutes, between 40 minutes and 240 minutes, between 40 minutes and 200 minutes, between 40 minutes and 100 minutes, between 40 minutes and 60 minutes, between 60 minutes and 240 minutes, between 60 minutes and 200 minutes, between 60 minutes and 100 minutes, between 100 minutes and 240 minutes, between 100 minutes and 200 minutes, or between 200 minutes and 240 minutes.

In some embodiments, at least one shell precursor and a nanocrystal core are simultaneously added to the solution comprising at least one first shell precursor. In some embodiments, the simultaneous addition is by injection of the shell precursor and core separately. In some embodiments, the shell precursor and core are added together before addition to the solution comprising a first shell precursor.

In some embodiments, the simultaneous addition in (c) of the second shell precursor and nanocrystal core to the solution comprising at least one first shell precursor occurs over a period of between 1 minute and 240 minutes, between 1 minute and 90 minutes, between 1 minute and 60 minutes, between 1 minute and 30 minutes, between 1 minute and 15 minutes, between 1 minute and 5 minutes, between 5 minutes and 240 minutes, between 5 minutes and 90 minutes, between 5 minutes and 60 minutes, between 5 minutes and 30 minutes, between 5 minute and 15 minutes, between 15 minutes and 240 minutes, between 15 minutes and 90 minutes, between 15 minutes and 60 minutes, between 15 minutes and 30 minutes, between 30 minutes and 240 minutes, between 30 minutes and 90 minutes, between 30 minutes and 60 minutes, between 60 minutes and 240 minutes, between 60 minutes and 90 minutes, or between 90 minutes and 240 minutes. In some embodiments, the simultaneous addition in (c) of the second shell precursor and nanocrystal core to the solution comprising at least one first shell precursor occurs over a period of between 15 minutes and 30 minutes.

In some embodiments, after at least one second shell precursor and a nanocrystal core are simultaneously added in (c) to the solution comprising at least one first shell precursor, the reaction mixture temperature is raised, lowered, or maintained to provide a temperature between 200° C. and 350° C., between 200° C. and 330° C., between 200° C. and 310° C., between 200° C. and 280° C., between 200° C. and 250° C., between 200° C. and 220° C., between 220° C. and 350° C., between 220° C. and 330° C., between 220° C. and 310° C., between 220° C. and 280° C., between 220° C. and 250° C., between 250° C. and 350° C., between 250° C. and 330° C., between 250° C. and 310° C., between 250° C. and 280° C., between 280° C. and 350° C., between 280° C. and 330° C., between 280° C. and 310° C., between 310° C. and 350° C., between 310° C. and 330° C., or between 330° C. and 350° C. In some embodiments, the second shell precursor is a Group VI shell precursor. In some embodiments, the second shell precursor is a sulfur source, a selenium source, or a combination thereof. In some embodiments, the reaction mixture temperature is raised, lowered, or maintained to provide to provide a temperature between 280° C. and 340° C. after addition of the Group VI shell precursor and nanocrystal core.

In some embodiments, after the simultaneous addition in (c) of the at least one shell precursor and nanocrystal core to the solution comprising a first shell precursor, the temperature of the reaction mixture is maintained at an elevated temperature for between 2 minutes and 240 minutes, between 2 minutes and 200 minutes, between 2 minutes and 100 minutes, between 2 minutes and 60 minutes, between 2 minutes and 40 minutes, between 5 minutes and 240 minutes, between 5 minutes and 200 minutes, between 5 minutes and 100 minutes, between 5 minutes and 60 minutes, between 5 minutes and 40 minutes, between 10 minutes and 240 minutes, between 10 minutes and 200 minutes, between 10 minutes and 100 minutes, between 10 minutes and 60 minutes, between 10 minutes and 40 minutes, between 40 minutes and 240 minutes, between 40 minutes and 200 minutes, between 40 minutes and 100 minutes, between 40 minutes and 60 minutes, between 60 minutes and 240 minutes, between 60 minutes and 200 minutes, between 60 minutes and 100 minutes, between 100 minutes and 240 minutes, between 100 minutes and 200 minutes, or between 200 minutes and 240 minutes. In some embodiments, after addition of the at least one shell precursor and core to the solution comprising a first shell precursor, the temperature of the reaction mixture is maintained at an elevated temperature for between 30 minutes and 120 minutes.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

In some embodiments, the present invention is directed to a method of producing a nanostructure comprising:
  (a) introducing a solution comprising at least one first shell precursor;
  (b) raising the temperature of the solution obtained in (a);
  (c) simultaneously adding at least one second shell precursor and a nanocrystal core to the solution of (a), wherein at least one of the second shell precursors in (c) is different from the at least one first shell precursor in (a); and
  (d) simultaneously adding at least two third shell precursors to the solution of (c), wherein at least one of the third shell precursors in (d) is different from the at least one second shell precursor in (c);
to provide a nanostructure.

In some embodiments, at least one first shell precursor and a solvent are introduced in (a) at a temperature between 20° C. and 310° C., between 20° C. and 280° C., between 20° C. and 250° C., between 20° C. and 200° C., between 20° C. and 150° C., between 20° C. and 100° C., between 20° C. and 50° C., between 50° C. and 310° C., between 50° C. and 280° C., between 50° C. and 250° C., between 50° C. and 200° C., between 50° C. and 150° C., between 50° C. and 100° C., between 100° C. and 310° C., between 100° C. and 280° C., between 100° C. and 250° C., between 100° C. and 200° C., between 100° C. and 150° C., between 150° C. and 310° C., between 150° C. and 280° C., between 150° C. and 250° C., between 150° C. and 200° C., between 200° C. and 310° C., between 200° C. and 280° C., between 200° C. and 250° C., between 250° C. and 310° C., between 250° C. and 280° C., or between 280° C. and 310° C. In some embodiments, the at least one first shell precursor is a Group II shell precursor. In some embodiments, the at least one first shell precursor is a zinc source. In some embodiments, a Group II shell precursor and a solvent are introduced in (a) at a temperature between 20° C. and 100° C.

In some embodiments, after introducing in (a) the at least one first shell precursor and a solvent, the temperature of the addition mixture is raised in (b) to an elevated temperature between 200° C. and 350° C., between 200° C. and 310° C., between 200° C. and 280° C., between 200° C. and 250° C., between 200° C. and 220° C., between 220° C. and 350° C., between 220° C. and 310° C., between 220° C. and 280° C., between 220° C. and 250° C., between 250° C. and 350° C., between 250° C. and 310° C., between 250° C. and 280° C., between 280° C. and 350° C., between 280° C. and 310° C., or between 310° C. and 350° C. In some embodiments, the at least one first shell precursor is a Group II shell precursor. In some embodiments, the at least one first shell precursor is a zinc source. In some embodiments, after contacting a Group II shell precursor and a solvent, the temperature of the addition mixture is raised in (b) to between 220° C. and 310° C.

In some embodiments, after introducing in (a) at least one shell precursor and a solvent, the time for the temperature to reach the elevated temperature is between 2 minutes and 240 minutes, between 2 minutes and 200 minutes, between 2 minutes and 100 minutes, between 2 minutes and 60 minutes, between 2 minutes and 40 minutes, between 5 minutes and 240 minutes, between 5 minutes and 200 minutes, between 5 minutes and 100 minutes, between 5 minutes and 60 minutes, between 5 minutes and 40 minutes, between 10 minutes and 240 minutes, between 10 minutes and 200 minutes, between 10 minutes and 100 minutes, between 10 minutes and 60 minutes, between 10 minutes and 40 minutes, between 40 minutes and 240 minutes, between 40 minutes and 200 minutes, between 40 minutes and 100 minutes, between 40 minutes and 60 minutes, between 60 minutes and 240 minutes, between 60 minutes and 200 minutes, between 60 minutes and 100 minutes, between 100 minutes and 240 minutes, between 100 minutes and 200 minutes, or between 200 minutes and 240 minutes.

In some embodiments, at least one second shell precursor and a nanocrystal core are simultaneously added in (c) to the solution comprising at least one first shell precursor. In some embodiments, the simultaneous addition is by injection of the shell precursor and core separately. In some embodiments, the shell precursor and core are added together before addition to the solution comprising a first shell precursor.

In some embodiments, the simultaneous addition in (c) of the second shell precursor and nanocrystal core to the solution comprising at least one first shell precursor occurs over a period of between 1 minute and 240 minutes, between 1 minute and 90 minutes, between 1 minute and 60 minutes, between 1 minute and 30 minutes, between 1 minute and 15 minutes, between 1 minute and 5 minutes, between 5 minutes and 240 minutes, between 5 minutes and 90 minutes, between 5 minutes and 60 minutes, between 5 minutes and 30 minutes, between 5 minute and 15 minutes, between 15 minutes and 240 minutes, between 15 minutes and 90 minutes, between 15 minutes and 60 minutes, between 15 minutes and 30 minutes, between 30 minutes and 240 minutes, between 30 minutes and 90 minutes, between 30 minutes and 60 minutes, between 60 minutes and 240 minutes, between 60 minutes and 90 minutes, or between 90 minutes and 240 minutes. In some embodiments, the simultaneous addition of the second shell precursor and nanocrystal core to the solution comprising at least one first shell precursor occurs over a period of between 15 minutes and 30 minutes.

In some embodiments, after at least one second shell precursor and a nanocrystal core are simultaneously added in (c) to the solution comprising at least one first shell precursor, the reaction mixture temperature is raised, lowered, or maintained to provide a temperature between 200° C. and 350° C., between 200° C. and 330° C., between 200° C. and 310° C., between 200° C. and 280° C., between 200° C. and 250° C., between 200° C. and 220° C., between 220° C. and 350° C., between 220° C. and 330° C., between 220° C. and 310° C., between 220° C. and 280° C., between 220° C. and 250° C., between 250° C. and 350° C., between 250° C. and 330° C., between 250° C. and 310° C., between 250° C. and 280° C., between 280° C. and 350° C., between 280° C. and 330° C., between 280° C. and 310° C., between 310° C. and 350° C., between 310° C. and 330° C., or between 330° C. and 350° C. In some embodiments, the second shell precursor is a Group VI shell precursor. In some embodiments, the second shell precursor is a sulfur source, a selenium source, or a combination thereof. In some embodiments, the reaction mixture temperature is raised, lowered, or maintained to provide a temperature between 280° C. and 340° C. after simultaneous addition in (c) of the Group VI shell precursor and nanocrystal core.

In some embodiments, after simultaneous addition in (c) of the at least one shell precursor and nanocrystal core to the solution comprising a first shell precursor, the temperature of the reaction mixture is maintained for between 2 and 240 minutes, between 2 and 200 minutes, between 2 and 100 minutes, between 2 and 60 minutes, between 2 and 40 minutes, between 5 and 240 minutes, between 5 and 200 minutes, between 5 and 100 minutes, between 5 and 60 minutes, between 5 and 40 minutes, between 10 and 240 minutes, between 10 and 200 minutes, between 10 and 100 minutes, between 10 and 60 minutes, between 10 and 40 minutes, between 40 and 240 minutes, between 40 and 200 minutes, between 40 and 100 minutes, between 40 and 60 minutes, between 60 and 240 minutes, between 60 and 200 minutes, between 60 and 100 minutes, between 100 and 240 minutes, between 100 and 200 minutes, or between 200 and 240 minutes. In some embodiments, after the simultaneous addition in (c) of the at least one shell precursor and core to the solution comprising a first shell precursor, the temperature of the reaction mixture is maintained for between 30 and 120 minutes.

In some embodiments, at least two third shell precursors for an additional shell are simultaneously added in (d) to the reaction mixture. In some embodiments, the simultaneous addition is by injection of the at least two third shell precursors separately. In some embodiments, the at least two third shell precursors are added together before addition to the reaction mixture.

In some embodiments, the simultaneous addition in (d) of the at least two third shell precursors to the reaction mixture occurs over a period of between 1 minute and 240 minutes, between 1 minute and 90 minutes, between 1 minute and 60 minutes, between 1 minute and 30 minutes, between 1 minute and 15 minutes, between 1 minute and 5 minutes, between 5 minutes and 240 minutes, between 5 minutes and 90 minutes, between 5 minutes and 60 minutes, between 5 minutes and 30 minutes, between 5 minute and 15 minutes, between 15 minutes and 240 minutes, between 15 minutes and 90 minutes, between 15 minutes and 60 minutes, between 15 minutes and 30 minutes, between 30 minutes and 240 minutes, between 30 minutes and 90 minutes, between 30 minutes and 60 minutes, between 60 minutes and 240 minutes, between 60 minutes and 90 minutes, or between 90 minutes and 240 minutes. In some embodiments, the simultaneous addition in (d) of the at least two third shell precursors to the reaction mixture occurs over a period of between 15 minutes and 30 minutes.

In some embodiments, after the at least two third shell precursors are simultaneously added in (d) to the reaction mixture, the reaction mixture temperature is raised, lowered, or maintained to provide a temperature between 200° C. and 350° C., between 200° C. and 330° C., between 200° C. and 310° C., between 200° C. and 280° C., between 200° C. and 250° C., between 200° C. and 220° C., between 220° C. and 350° C., between 220° C. and 330° C., between 220° C. and 310° C., between 220° C. and 280° C., between 220° C. and 250° C., between 250° C. and 350° C., between 250° C. and 330° C., between 250° C. and 310° C., between 250° C. and 280° C., between 280° C. and 350° C., between 280° C. and 330° C., between 280° C. and 310° C., between 310° C. and 350° C., between 310° C. and 330° C., or between 330° C. and 350° C. In some embodiments, the at least two third shell precursors are: a zinc source and a sulfur source; a zinc source and a selenium source; or a zinc source, a sulfur source, and a selenium source. In some embodiments, the reaction mixture temperature is raised, lowered, or maintained to provide a temperature between 280° C. and 340° C. after simultaneous addition in (d) of the at least two third shell precursors.

In some embodiments, after the simultaneous addition in (d) of the at least two third shell precursors to the reaction mixture, the temperature of the reaction mixture is maintained for between 2 and 240 minutes, between 2 and 200 minutes, between 2 and 100 minutes, between 2 and 60 minutes, between 2 and 40 minutes, between 5 and 240 minutes, between 5 and 200 minutes, between 5 and 100 minutes, between 5 and 60 minutes, between 5 and 40 minutes, between 10 and 240 minutes, between 10 and 200 minutes, between 10 and 100 minutes, between 10 and 60 minutes, between 10 and 40 minutes, between 40 and 240 minutes, between 40 and 200 minutes, between 40 and 100 minutes, between 40 and 60 minutes, between 60 and 240 minutes, between 60 and 200 minutes, between 60 and 100 minutes, between 100 and 240 minutes, between 100 and 200 minutes, or between 200 and 240 minutes. In some embodiments, after the simultaneous addition in (d) of the at least two third shell precursors are added to the reaction mixture, the temperature of the reaction mixture is maintained for between 30 and 120 minutes.

In some embodiments, the present invention is directed to a method of producing a nanostructure comprising:
  (a) simultaneously adding at least one first shell precursor and a nanocrystal core to a solution wherein the solution is at a temperature between 200° C. and 350° C.;
  (b) simultaneously adding at least two second shell precursors to the solution of (a), wherein at least one of the second shell precursors in (b) is different from the first shell precursor in (a);
to provide a nanostructure.

In some embodiments, at least one first shell precursor and nanocrystal core are simultaneously added in (a) to a solution at a temperature between 200° C. and 350° C., between 200° C. and 330° C., between 200° C. and 310° C., between 200° C. and 280° C., between 200° C. and 250° C., between 200° C. and 220° C., between 220° C. and 350° C., between 220° C. and 330° C., between 220° C. and 310° C., between 220° C. and 280° C., between 220° C. and 250° C., between 250° C. and 350° C., between 250° C. and 330° C., between 250° C. and 310° C., between 250° C. and 280° C., between 280° C. and 350° C., between 280° C. and 330° C., between 280° C. and 310° C., between 310° C. and 350° C., between 310° C. and 330° C., or between 330° C. and 350° C. In some embodiments, the first shell precursor is a Group VI shell precursor. In some embodiments, the shell precursor is a selenium source. In some embodiments, the at least one first shell precursor and nanocrystal core are simultaneously added to a solution at a temperature between 280° C. and 310° C.

In some embodiments, at least one shell precursor and a nanocrystal core are simultaneously added to the solution in (a). In some embodiments, the simultaneous addition is by injection of the shell precursor and core separately. In some embodiments, the shell precursor and core are added together before addition to the solution.

In some embodiments, the simultaneous addition in (a) of the first shell precursor and nanocrystal core to the solution occurs over a period of between 1 minute and 240 minutes, between 1 minute and 90 minutes, between 1 minute and 60 minutes, between 1 minute and 30 minutes, between 1 minute and 15 minutes, between 1 minute and 5 minutes, between 5 minutes and 240 minutes, between 5 minutes and 90 minutes, between 5 minutes and 60 minutes, between 5 minutes and 30 minutes, between 5 minute and 15 minutes, between 15 minutes and 240 minutes, between 15 minutes and 90 minutes, between 15 minutes and 60 minutes, between 15 minutes and 30 minutes, between 30 minutes and 240 minutes, between 30 minutes and 90 minutes, between 30 minutes and 60 minutes, between 60 minutes and 240 minutes, between 60 minutes and 90 minutes, or between 90 minutes and 240 minutes. In some embodiments, the simultaneous addition of the first shell precursor and nanocrystal core to the solution occurs over a period of between 15 minutes and 30 minutes.

In some embodiments, after at least two second shell precursors are simultaneously added to the reaction mixture in (b), the reaction mixture temperature is raised, lowered, or maintained to provide a temperature between 200° C. and 350° C., between 200° C. and 330° C., between 200° C. and 310° C., between 200° C. and 280° C., between 200° C. and 250° C., between 200° C. and 220° C., between 220° C. and 350° C., between 220° C. and 330° C., between 220° C. and 310° C., between 220° C. and 280° C., between 220° C. and 250° C., between 250° C. and 350° C., between 250° C. and 330° C., between 250° C. and 310° C., between 250° C. and 280° C., between 280° C. and 350° C., between 280° C. and 330° C., between 280° C. and 310° C., between 310° C. and 350° C., between 310° C. and 330° C., or between 330° C. and 350° C. In some embodiments, at least one of the second shell precursors is a Group VI shell precursor. In some embodiments, at least one of the second shell precursors is a Group II shell precursor. In some embodiments, the at least two third shell precursors are: a zinc source and a sulfur source; a zinc source and a selenium source; or a zinc source, a sulfur source, and a selenium source. In some embodiments, the reaction mixture temperature is raised, lowered, or maintained to provide a temperature between 280° C. and 340° C. after addition of the at least two second shell precursors in (b).

In some embodiments, after simultaneous addition in (b) of the at least two second shell precursors to the reaction mixture, the temperature of the reaction mixture is maintained for between 2 and 240 minutes, between 2 and 200 minutes, between 2 and 100 minutes, between 2 and 60 minutes, between 2 and 40 minutes, between 5 and 240 minutes, between 5 and 200 minutes, between 5 and 100 minutes, between 5 and 60 minutes, between 5 and 40 minutes, between 10 and 240 minutes, between 10 and 200 minutes, between 10 and 100 minutes, between 10 and 60 minutes, between 10 and 40 minutes, between 40 and 240 minutes, between 40 and 200 minutes, between 40 and 100 minutes, between 40 and 60 minutes, between 60 and 240 minutes, between 60 and 200 minutes, between 60 and 100 minutes, between 100 and 240 minutes, between 100 and 200 minutes, or between 200 and 240 minutes. In some embodiments, after addition of the at least two second shell precursors to the reaction mixture, the temperature of the reaction mixture is maintained for between 30 and 120 minutes.

After sufficient layers of shell have been added for the nanostructure to reach the desired thickness and diameter, the nanostructure can be cooled. In some embodiments, the nanostructures are cooled to room temperature. In some embodiments, an organic solvent is added to dilute the reaction mixture comprising the nanostructures.

In some embodiments, the organic solvent used to dilute the reaction mixture comprising the nanostructures is ethanol, hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, nanostructures are isolated. In some embodiments, the nanostructures are isolated by precipitation using an organic solvent. In some embodiments, the nanostructures are isolated by flocculation with ethanol.

The number of shells will determine the size of the nanostructures. The size of the nanostructures can be determined using techniques known to those of skill in the art. In some embodiments, the size of the nanostructures is determined using TEM. In some embodiments, the nanostructures have an average diameter of between 1 nm and 15 nm, between 1 nm and 10 nm, between 1 nm and 9 nm, between 1 nm and 8 nm, between 1 nm and 7 nm, between 1 nm and 6 nm, between 1 nm and 5 nm, between 5 nm and 15 nm, between 5 nm and 10 nm, between 5 nm and 9 nm, between 5 nm and 8 nm, between 5 nm and 7 nm, between 5 nm and 6 nm, between 6 nm and 15 nm, between 6 nm and 10 nm, between 6 nm and 9 nm, between 6 nm and 8 nm, between 6 nm and 7 nm, between 7 nm and 15 nm, between 7 nm and 10 nm, between 7 nm and 9 nm, between 7 nm and 8 nm, between 8 nm and 15 nm, between 8 nm and 10 nm, between 8 nm and 9 nm, between 9 nm and 15 nm, between 9 nm and 10 nm, or between 10 nm and 15 nm. In some embodiments, the nanostructures have an average diameter of between 6 nm and 7 nm.

The synthesis of an InP/ZnSe/ZnS core/shell quantum dot using the method of the present invention is described in Example 7. As described in Example 7, InP cores were mixed with a zinc source to form Stock 1. And this, along with Stock 2—which contains a selenium source—were simultaneously injected into a solvent mixture of oleic acid and octadecene preheated to 280-310° C. to allow for homogeneous growth of the ZnSe shell. Once shell growth was complete, the particles became chemically more stable and it was possible to grow the outer shell of ZnS using a conventional shelling method. The amount of InP core was adjusted to make the total volume of the reaction fit into the volume of the reaction vessel. The amounts of shell materials—zinc oleate, trioctylphosphine selenide, and dodecanethiol, were calculated based on the designated shell thickness, the size of the InP cores, and the number of cores. The amount of oleic acid was determined by assigning 4,000 oleic acid molecules for each InP core. The amount of octadecene in the growth solution was determined by using a volume ratio of octadecene to oleic acid of 1.5. The amount of octadecene in Stock 2 was identical to the amount of octadecene in Stock 1. And, the amount of octadecene in Stock 4 was identical to the amount of octadecene in Stock 3.

Production of a ZnSe Shell

In some embodiments, the shell deposited onto the core or core/shell(s) nanostructure is a ZnSe shell.

In some embodiments, the shell precursors used to prepare a ZnSe shell comprise a zinc source and a selenium source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, the molar ratio of core to zinc source shell precursor to prepare a ZnSe shell is between 1:2 and 1:1000, between 1:2 and 1:100, between 1:2 and 1:50, between 1:2 and 1:25, between 1:2 and 1:15, between 1:2 and 1:10, between 1:2 and 1:5, between 1:5 and 1:1000, between 1:5 and 1:100, between 1:5 and 1:50, between 1:5 and 1:25, between 1:5 and 1:15, between 1:5 and 1:10, between 1:10 and 1:1000, between 1:10 and 1:100, between 1:10 and 1:50, between 1:10 and 1:25, between 1:10 and 1:15, between 1:15 and 1:1000, between 1:15 and 1:100, between 1:15 and 1:50, between 1:15 and 1:25, between 1:25 and 1:1000, between 1:25 and 1:100, between 1:25 and 1:50, or between 1:50 and 1:1000, between 1:50 and 1:100, between 1:100 and 1:1000.

In some embodiments, the molar ratio of core to selenium source shell precursor to prepare a ZnSe shell is between 1:2 and 1:1000, between 1:2 and 1:100, between 1:2 and 1:50, between 1:2 and 1:25, between 1:2 and 1:15, between 1:2 and 1:10, between 1:2 and 1:5, between 1:5 and 1:1000, between 1:5 and 1:100, between 1:5 and 1:50, between 1:5 and 1:25, between 1:5 and 1:15, between 1:5 and 1:10, between 1:10 and 1:1000, between 1:10 and 1:100, between 1:10 and 1:50, between 1:10 and 1:25, between 1:10 and 1:15, between 1:15 and 1:1000, between 1:15 and 1:100, between 1:15 and 1:50, between 1:15 and 1:25, between 1:25 and 1:1000, between 1:25 and 1:100, between 1:25 and 1:50, or between 1:50 and 1:1000, between 1:50 and 1:100, between 1:100 and 1:1000.

In some embodiments, each ZnSe shell has a thickness of between 0.08 nm and 3.5 nm, between 0.08 nm and 2 nm, between 0.08 nm and 0.9 nm, 0.08 nm and 0.7 nm, between 0.08 nm and 0.5 nm, between 0.08 nm and 0.2 nm, between 0.2 nm and 3.5 nm, between 0.2 nm and 2 nm, between 0.2 nm and 0.9 nm, between 0.2 nm and 0.7 nm, between 0.2 nm and 0.5 nm, between 0.5 nm and 3.5 nm, between 0.5 nm and 2 nm, between 0.5 nm and 0.9 nm, between 0.5 nm and 0.7 nm, between 0.7 nm and 3.5 nm, between 0.7 nm and 2 nm, between 0.7 nm and 0.9 nm, between 0.9 nm and 3.5 nm, between 0.9 nm and 2 nm, or between 2 nm and 3.5 nm.

Production of a $ZnSe_xS_{1-x}$ Shell

In some embodiments, the highly luminescent nanostructures include a shell layer between an inner shell and an outer shell. In some embodiments, the nanostructure comprises a $ZnSe_xS_{1-x}$ shell, wherein $0<x<1$.

In some embodiments, the nanostructure comprises a $ZnSe_xS_{1-x}$ shell, wherein x is between 0 and 1. In some embodiments, x is between 0.01 and 0.99. In some embodiments, x is between 0.25 and 1, between 0.25 and 0.75, between 0.25 and 0.5, between 0.5 and 1, between 0.5 and 0.75, or between 0.75 and 1. In some embodiments, x is 0.5.

In some embodiments, the $ZnSe_xS_{1-x}$ shell eases lattice strain between a ZnSe shell and a ZnS shell.

In some embodiments, the x of the $ZnSe_xS_{1-x}$ shell gradually decreases from the interior to the exterior of the resulting nanostructure.

In some embodiments, the shell precursors used to prepare a layer of a $ZnSe_xS_{1-x}$ shell comprise a zinc source, a selenium source, and a sulfur source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is an alkyl-substituted zinc dithiocarbamate. In some embodiments, the sulfur source is octanethiol.

Production of a ZnS Shell

In some embodiments, the shell deposited onto the core or core/shell(s) nanostructure is a ZnS shell.

In some embodiments, the shell precursors used to prepare a ZnS shell comprise a zinc source and a sulfur source.

In some embodiments, the ZnS shell passivates defects at the particle surface, which leads to an improvement in the quantum yield and to higher efficiencies when used in devices such as LEDs and lasers. Furthermore, spectral impurities which are caused by defect states may be eliminated by passivation, which increases the color saturation.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the zinc source is produced by reacting a zinc salt with a carboxylic acid. In some embodiments, the carboxylic acid is selected from acetic acid, propionic acid, butyric acid, valeric acid, caproic acid, heptanoic acid, caprylic acid, capric acid, undecanoic acid, lauric acid, myristic acid, palmitic acid, stearic acid, behenic acid, acrylic acid, methacrylic acid, but-2-enoic acid, but-3-enoic acid, pent-2-enoic acid, pent-4-enoic acid, hex-2-enoic acid, hex-3-enoic acid, hex-4-enoic acid, hex-5-enoic acid, hept-6-enoic acid, oct-2-enoic acid, dec-2-enoic acid, undec-10-enoic acid, dodec-5-enoic acid, oleic acid, gadoleic acid, erucic acid, linoleic acid, α-linolenic acid, calendic acid, eicosadienoic acid, eicosatrienoic acid, arachidonic acid, stearidonic acid, benzoic acid, para-toluic acid, ortho-toluic acid, meta-toluic acid, hydrocinnamic acid, naphthenic acid, cinnamic acid, para-toluenesulfonic acid, and mixtures thereof.

In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is an alkyl-substituted zinc dithiocarbamate. In some embodiments, the sulfur source is octanethiol.

In some embodiments, the molar ratio of core to zinc source shell precursor to prepare a ZnS shell is between 1:2 and 1:1000, between 1:2 and 1:100, between 1:2 and 1:50, between 1:2 and 1:25, between 1:2 and 1:15, between 1:2 and 1:10, between 1:2 and 1:5, between 1:5 and 1:1000, between 1:5 and 1:100, between 1:5 and 1:50, between 1:5 and 1:25, between 1:5 and 1:15, between 1:5 and 1:10, between 1:10 and 1:1000, between 1:10 and 1:100, between 1:10 and 1:50, between 1:10 and 1:25, between 1:10 and 1:15, between 1:15 and 1:1000, between 1:15 and 1:100, between 1:15 and 1:50, between 1:15 and 1:25, between 1:25 and 1:1000, between 1:25 and 1:100, between 1:25 and 1:50, or between 1:50 and 1:1000, between 1:50 and 1:100, between 1:100 and 1:1000.

In some embodiments, the molar ratio of core to selenium source shell precursor to prepare a ZnS shell is between 1:2 and 1:1000, between 1:2 and 1:100, between 1:2 and 1:50, between 1:2 and 1:25, between 1:2 and 1:15, between 1:2 and 1:10, between 1:2 and 1:5, between 1:5 and 1:1000, between 1:5 and 1:100, between 1:5 and 1:50, between 1:5 and 1:25, between 1:5 and 1:15, between 1:5 and 1:10, between 1:10 and 1:1000, between 1:10 and 1:100, between 1:10 and 1:50, between 1:10 and 1:25, between 1:10 and 1:15, between 1:15 and 1:1000, between 1:15 and 1:100, between 1:15 and 1:50, between 1:15 and 1:25, between 1:25 and 1:1000, between 1:25 and 1:100, between 1:25 and 1:50, or between 1:50 and 1:1000, between 1:50 and 1:100, between 1:100 and 1:1000.

In some embodiments, each ZnS shell has a has a thickness of between 0.08 nm and 3.5 nm, between 0.08 nm and 2 nm, between 0.08 nm and 0.9 nm, 0.08 nm and 0.7 nm, between 0.08 nm and 0.5 nm, between 0.08 nm and 0.2 nm, between 0.2 nm and 3.5 nm, between 0.2 nm and 2 nm, between 0.2 nm and 0.9 nm, between 0.2 nm and 0.7 nm, between 0.2 nm and 0.5 nm, between 0.5 nm and 3.5 nm, between 0.5 nm and 2 nm, between 0.5 nm and 0.9 nm, between 0.5 nm and 0.7 nm, between 0.7 nm and 3.5 nm, between 0.7 nm and 2 nm, between 0.7 nm and 0.9 nm, between 0.9 nm and 3.5 nm, between 0.9 nm and 2 nm, or between 2 nm and 3.5 nm.

Nanostructures

In some embodiments, the nanostructure is a core/ZnSe/ZnS nanostructure or a core/ZnSe/ZnSe$_x$S$_{1-x}$/ZnS nanostructure. In some embodiments, the nanostructure is a InP/ZnSe/ZnS nanostructure or a InP/ZnSe/ZnSe$_x$S$_{1-x}$/ZnS nanostructure.

In some embodiments, the nanostructures display a high photoluminescence quantum yield. In some embodiments, the nanostructures display a photoluminescence quantum yield of between 60% and 99%, between 60% and 95%, between 60% and 90%, between 60% and 85%, between 60% and 80%, between 60% and 70%, between 70% and 99%, between 70% and 95%, between 70% and 90%, between 70% and 85%, between 70% and 80%, between 80% and 99%, between 80% and 95%, between 80% to 90%, between 80% and 85%, between 85% and 99%, between 85% and 95%, between 80% and 85%, between 85% and 99%, between 85% and 90%, between 90% and 99%, between 90% and 95%, or between 95% and 99%. In some embodiments, the nanostructures display a photoluminescence quantum yield of between 85% and 96%.

The photoluminescence spectrum of the nanostructures can cover essentially any desired portion of the spectrum. In some embodiments, the photoluminescence spectrum for the nanostructures have a emission maximum between 300 nm and 750 nm, between 300 nm and 650 nm, between 300 nm and 550 nm, between 300 nm and 450 nm, between 450 nm and 750 nm, between 450 nm and 650 nm, between 450 nm and 550 nm, between 450 nm and 750 nm, between 450 nm and 650 nm, between 450 nm and 550 nm, between 550 nm and 750 nm, between 550 nm and 650 nm, or between 650 nm and 750 nm. In some embodiments, the photoluminescence spectrum for the nanostructures has an emission maximum of between 500 nm and 550 nm. In some embodiments, the photoluminescence spectrum for the nanostructures has an emission maximum of between 600 nm and 650 nm.

The size distribution of the nanostructures can be relatively narrow. In some embodiments, the photoluminescence spectrum of the population of nanostructures can have a full width at half maximum of between 10 nm and 60 nm, between 10 nm and 40 nm, between 10 nm and 30 nm, between 10 nm and 20 nm, between 20 nm and 60 nm, between 20 nm and 40 nm, between 20 nm and 30 nm, between 30 nm and 60 nm, between 30 nm and 40 nm, or between 40 nm and 60 nm. In some embodiments, the photoluminescence spectrum of the population of nanostructures can have a full width at half maximum of between 35 nm and 45 nm.

In some embodiments, the nanostructures of the present invention are able to maintain high levels of photoluminescence intensity for long periods of time under continuous blue light exposure. In some embodiments, the nanostructures are able to maintain 90% intensity (compared to the starting intensity level) of at least 2,000 hours, at least 4,000 hours, at least 6,000 hours, at least 8,000 hours, or at least 10,000 hours. In some embodiments, the core/shell(s) nanostructures are able to maintain 80% intensity (compared to the starting intensity level) of at least 2,000 hours, at least 4,000 hours, at least 6,000 hours, at least 8,000 hours, or at least 10,000 hours. In some embodiments, the core/shell(s) nanostructures are able to maintain 70% intensity (compared to the starting intensity level) of at least 2,000 hours, at least 4,000 hours, at least 6,000 hours, at least 8,000 hours, or at least 10,000 hours.

In some embodiments, the nanostructures of the present invention have a tetrahedral shape. The shape of the nanostructures can be determined by visual inspection. In some embodiments, the tetrahedral shape of the nanostructures is observed by visual inspection of a TEM image.

In some embodiments, a population of nanostructures that has a tetrahedral shape is a population where at least 75%, at least 80%, at least 85%, at least 90%, or at least 95% of the nanostructures have a tetrahedral shape. In some embodiments, a population of nanostructures that has a tetrahedral shape is a population where at least 85% of the nanostructures have a tetrahedral shape.

The resulting nanostructures are optionally embedded in a matrix (e.g., an organic polymer, silicon-containing polymer, inorganic, glassy, and/or other matrix), used in production of a nanostructure phosphor, and/or incorporated into a device, e.g., an LED, backlight, downlight, or other display or lighting unit or an optical filter. Exemplary phosphors and lighting units can, e.g., generate a specific color light by incorporating a population of nanostructures with an emission maximum at or near the desired wavelength or a wide color gamut by incorporating two or more different populations of nanostructures having different emission maxima. A variety of suitable matrices are known in the art. See, e.g., U.S. Pat. No. 7,068,898 and U.S. Patent Application Publication Nos. 2010/0276638, 2007/0034833, and 2012/0113672. Exemplary nanostructure phosphor films, LEDs, backlighting units, etc. are described, e.g., in U.S. Patent Application Publications Nos. 2010/0276638, 2012/

0113672, 2008/0237540, 2010/0110728, and 2010/0155749 and U.S. Pat. Nos. 7,374,807, 7,645,397, 6,501,091, and 6,803,719.

The relative molar ratios of InP, ZnSe, and ZnS are calculated based on a spherical InP core of a given diameter by measuring the volumes, masses, and thus molar amounts of the desired spherical shells.

The resulting nanostructures can be used for imaging or labeling, e.g., biological imaging or labeling. Thus, the resulting nanostructures are optionally covalently or noncovalently bound to biomolecule(s), including, but not limited to, a peptide or protein (e.g., an antibody or antibody domain, avidin, streptavidin, neutravidin, or other binding or recognition molecule), a ligand (e.g., biotin), a polynucleotide (e.g., a short oligonucleotide or longer nucleic acid), a carbohydrate, or a lipid (e.g., a phospholipid or other micelle). One or more nanostructures can be bound to each biomolecule, as desired for a given application. Such nanostructure-labeled biomolecules find use, for example, in vitro, in vivo, and in cellulo, e.g., in exploration of binding or chemical reactions as well as in subcellular, cellular, and organismal labeling.

Nanostructures resulting from the methods are also a feature of the invention. Thus, one class of embodiments provides a population of nanostructures. In some embodiments, the nanostructures are quantum dots.

Coating the Nanostructures with an Oxide Material

Regardless of their composition, most quantum dots do not retain their originally high quantum yield after continuous exposure to excitation photons. Although the use of thick shells may prove effective in mitigating the effects of photoinduced quantum yield deterioration, the photodegradation of quantum dots may be further retarded by encasing them with an oxide. Coating quantum dots with an oxide causes their surface to become physically isolated from their environments.

Coating quantum dots with an oxide material has been shown to increase their photostability. In Jo, J.-H., et al., *J. Alloys & Compounds* 647:6-13 (2015), InP/ZnS red-emitting quantum dots were overcoated with an oxide phase of $In_2O_3$ which was found to substantially alleviate quantum dot photodegradation as shown by comparative photostability results.

In some embodiments, the nanostructures are coated with an oxide material for increased stability. In some embodiments, the oxide material is $In_2O_3$, $SiO_2$, $Al_2O_3$, or $TiO_2$.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

Synthesis of Red InP Cores

To a 500 mL 3-necked flask was added 11.64 g of $In(OAc)_3$ (indium acetate), 23.5 g of lauric acid, and 17.0 g of trioctylphosphine oxide (TOPO) under ambient conditions. The flask was evacuated and purged (with dry nitrogen) for three cycles to remove air. After the last nitrogen purge, the mixture was heated to 180° C. and the temperature was held for 30 minutes to allow complete conversion of $In(OAc)_3$ to indium laurate. The mixture was in clear ligand form at the end of the hold period. The temperature was set to 160° C. and a purge trap was inserted through a septum attached to the flask to purge out the by-product, acetic acid. After 120 minutes of purging at 160° C., the temperature was increased to 230° C. for 50 minutes, and to 240° C. for 10 minutes before the purge trap was removed. The solution was a bronze yellow color at this point. Two stock solutions were prepared during the purge:

Stock 1: 7.5 g of 16.7% Tris(trimethylsilyl)phosphine ($TMS_3$P-TOP) solution+3.0 g trioctylphosphine (TOP);

Stock 2: 7.5 g of 16.7% $TMS_3$P in 5.68% DEZ-ODE-TOP (20% diethyl zinc solution in 1-octadecene solution in TOP)+3.0 g TOP After purging, the solution was cooled to 110° C. and the septum was replaced with a new one. The system was switched to vacuum and maintained for 10 minutes to remove the residual acetic acid. After switching the system back to nitrogen the temperature was increased to 330° C. Upon reaching 320° C., Stock 1 was injected swiftly into the solution. 30 seconds later, the temperature was set to 280° C. After a 4 minute hold at 280° C., Stock 2 was injected over 4 minutes through a syringe pump into the solution. After the injection of Stock 2, the reaction was held at 280° C. for another 4 minutes before cooling down to 80° C. The growth solution was then brought into a glove box and an equal volume of toluene was added. The InP cores were precipitated out by adding ethanol (1:1 by volume). Finally, the cores were isolated by centrifugation and resuspended in hexane.

Example 2

Synthesis of Green InP Cores

To a 250 mL three-neck round bottom flask was added 4.66 g of $In(OAc)_3$, 100 mg of zinc acetate ($Zn(OAc)_2$), 9.6 g of lauric acid, and 6.0 g of TOPO. The flask was capped with two rubber septa and a glass joint adaptor (side neck). The flask was attached to a Schenk line and the flask was left under nitrogen flow. A thermal coupler was placed in a neck of the reaction flask, secured with a clamp, and the flask was wrapped with glass wool. The temperature was set to 160° C. to start heating and the stir rate was slowly increased to 700 rpm. While the solid was liquefying, it was necessary to avoid splash to the side wall. Once the temperature reached 160° C., it was held for 20 minutes.

A $TMS_3$P-TOP stock solution was prepared by mixing 2.0 g of $TMS_3$P and 6.0 g of TOP in a 20 mL vial inside the glove box. The $TMS_3$P-TOP stock solution was loaded into a 25 mL syringe. The flask was slowly switched from nitrogen flow to vacuum and vacuum was held for 40 minutes. The temperature was increased to 230° C. and held for 20 minutes. The flask was refilled with nitrogen, the temperature was increased to 305° C., and the stir rate was slowly increased. Take the $TMS_3$P-TOP syringe out from the glove-box. Once the temperature reached 305° C., the $TMS_3$P-TOP stock solution was injected as quickly as possible and a timer was started. The heating mantle was turned off and was removed after 55 seconds, while maintaining a fast stir rate and an air gun was used to cool down the reaction mixture to below 180° C. The flask was allowed to cool down to room temperature and the two rubber septa were replaced. The flask was transferred into the glove box, the reaction mixture was diluted with toluene (1:1), and InP cores were precipitated using ethanol (1:1). The InP cores were isolated by centrifugation at 4000 rpm for 10 minutes. The InP cores were resuspended in hexane.

Example 3

Synthesis of Red InP/ZnSe Quantum Dots Using a Conventional Method

To a 100 mL 3-neck flask under nitrogen at room temperature was injected 2.0 mL of TOP, 10.4 mL of 0.5 M zinc oleate $(Zn(Ol)_2)$-TOP solution, and a 2.5 mL InP core solution in TOP (containing 150 mg InP core). The first excitonic absorption peak of the InP cores was 570 nm and the average diameter of the cores was about 2.6 nm. After injection, the reaction temperature was set to 240-280° C. Once the temperature stabilized at 240-280° C., a stock solution (Stock 1) was inserted into the flask over 15-30 minutes through a syringe pump.

Stock 1 was prepared by mixing 1.2 mL of oleic acid (OA) and 1.3 mL of 2.0 M trioctylphosphine selenide (TOP-Se). After injection of Stock 1 was complete, the temperature was ramped to 300-330° C. over a period of 30-60 minutes. Once the target temperature was reached, the reaction mixture was held at 300-330° C. for 5-15 minutes. The flask was then cooled to room temperature and brought into a nitrogen glove box for processing of the quantum dots.

Example 4

Synthesis of Red InP/ZnSe/ZnS Quantum Dots Using a Conventional Method

To a 100 mL 3-neck flask under nitrogen at room temperature was injected 2.0 mL TOP, a 10.4 mL 0.5 M $Zn(Ol)_2$-TOP solution, and a 2.5 mL InP core solution in TOP (containing 150 mg InP core). The first excitonic absorption peak of the InP cores was 570 nm and the average diameter of the cores was about 2.6 nm. After injection, the reaction temperature was set to 240-280° C. Once the temperature stabilized at 240-280° C., a stock solution (Stock 1) was inserted into the flask over 15-30 minutes through a syringe pump.

Stock 1 was prepared by mixing 1.2 mL of OA and 1.3 mL of a 2.0 M solution of TOP-Se. After injection of Stock 1 was complete, the temperature was ramped to 300-330° C. over a period of 30-60 minutes. Once the target temperature was reached, two stock solutions, Stock 2 and Stock 3 were injected into the flask over 60-90 minutes through syringe pumps.

Stock 2 was a 25 mL 0.5 M $Zn(Ol)_2$-TOP solution and Stock 3 was a 13 mL 1.0 M TOP-S solution. After the injection was complete, the reaction mixture was held at 300-330° C. for 5-15 minutes before being brought into a nitrogen glove box for further processing of the quantum dots.

Example 5

Synthesis of Red InP/ZnSe Quantum Dots Using the New Method

To a 100 mL 3-neck flask under nitrogen at room temperature was injected 2.0 mL of TOP and 10.4 mL of a 0.5 M $Zn(Ol)_2$-TOP solution. After injection, the reaction temperature was set to 240-280° C. Once the temperature stabilized at 240-280° C., a stock solution (Stock 1) was inserted into the flask over 15-30 minutes through a syringe pump.

Stock 1 was prepared by mixing 1.2 mL of OA, 1.3 mL of a 2.0 M solution of TOP-Se, and a 2.5 mL InP core solution in TOP (containing 150 mg InP core). The first excitonic absorption peak of the InP cores was 570 nm and the average diameter of the cores was about 2.6 nm.

After the injection of Stock 1 was complete, the temperature was ramped to 300-330° C. over a period of 30-60 minutes. Once the target temperature was reached, the reaction was held at 300-330° C. over a period of 5-15 minutes. Afterwards, the flask was cooled to room temperature and brought into a nitrogen glove box for further processing of the quantum dots.

Example 6

Synthesis of Red InP/ZnSe/ZnS Quantum Dots Using the New Method

To a 100 mL 3-neck flask under nitrogen at room temperature was injected 2.0 mL of TOP and 10.4 mL of a 0.5 M $Zn(Ol)_2$-TOP solution. After the injection, the reaction temperature was set to 240-280° C. Once the temperature was stabilized at 240-280° C., a stock solution (Stock 1) was inserted into the flask over 15-30 minutes through a syringe pump.

Stock 1 was prepared by mixing 1.2 mL of OA, 1.3 mL of a 2.0 M solution of TOP-Se, and a 2.5 mL InP core solution in TOP (containing 150 mg InP core). The first excitonic absorption peak of the InP cores was 570 nm and the average diameter of the cores was about 2.6 nm.

After the injection of the Stock 1 was complete, the temperature was ramped to 300-330° C. over a period of 30-60 minutes. Once the target temperature was reached, two stock solutions, Stock 2 and Stock 3 were simultaneously injected into the flask over 60-90 minutes through syringe pumps. Stock 2 was 25 mL of a 0.5 M $Zn(Ol)_2$-TOP solution and Stock 3 was 13 mL of a 1.0 M TOP-S solution.

After injection, the reaction mixture was held at 300-330° C. over a period of 5-15 minutes before being brought into a nitrogen glove box for further processing of the quantum dots.

Example 7

Synthesis of InP/ZnSe/ZnS Quantum Dots Using the New Method

To a 100 mL 3-neck flask under nitrogen at room temperature was injected 6.0 mL 1-octadecene (ODE) and 4.0 mL OA. After injection, the reaction temperature was set to 280-310° C. Once the temperature stabilized at 280-310° C., two stock solutions were injected simultaneously into the reactor within 15-30 minutes through syringe pumps.

The two stock solutions were prepared separately:
  Stock 1 was a mixture of 7.0 mL ODE and a 1.7 mL InP core solution in TOP containing 90 mg of InP cores. The first excitonic absorption peak of the InP cores was 580 nm and the average diameter of the cores was about 2.7 nm.
  Stock 2 was a mixture of 7.7 mL ODE and 1.5 mL of a 2.0 M TOP-Se solution.

Following the simultaneous injection of Stock 1 and 2, reaction was held for 5-15 minutes. After the hold time, Stock 3 and Stock 4 were simultaneously injected through syringe pumps in 60-90 minutes at the same temperatures. Stock 3 was 15 mL of a 0.5 M $Zn(Ol)_2$-TOP solution. Stock 4 was a mixture of 8.0 mL ODE, 3.5 mL TOP, and 3.5 mL dodecanethiol (DDT).

After injection, the reaction was held for 5-15 minutes before being cooled down to room temperature. The reaction mixture was then brought into a nitrogen glove box for further processing of the resulting quantum dots.

TABLE 1

Comparison of optical properties of InP/ZnSe/ZnS quantum dots synthesized by different methods

| Shelling Method | Emission Wavelength (nm) | FWHM (nm) | QY (%) |
|---|---|---|---|
| New (cores in stock solution) | 623.8 | 46.1 | 64 |
| Conventional (cores in growth solution) | 621.6 | 56.6 | 49.6 |

In order to make a side-by-side comparison of the optical properties of InP/ZnSe/ZnS quantum dots synthesized by the method of the present invention—as shown in Example 7—and the conventional methodology, oleic acid was added to the shell growth solution instead of to the growth solution as described as shown in Example 2 so that the cores would not be dissolved before shelling begins. The results are summarized in TABLE 1.

As shown in TABLE 1, the new method yields quantum dots of higher quantum yield and narrower FWHM than the conventional method. In TABLE 1, the FWHM of the quantum dots using the new methodology was not as narrow as shown in the FIGURE because the ratio of the oleic acid molecules and the InP cores was approximately 4,000 to 600 to reduce the etching of the InP cores.

Having now fully described this invention, it will be understood by those of ordinary skill in the art that the same can be performed within a wide and equivalent range of conditions, formulations and other parameters without affecting the scope of the invention or any embodiment thereof. All patents, patent applications, and publications cited herein are fully incorporated by reference herein in their entirety.

What is claimed is:

1. A population of InP/ZnSe/ZnS nanostructures, wherein at least 75% of the population of nanostructures has a tetrahedral shape.

2. The population of nanostructures of claim 1, wherein the nanostructures display a photoluminescence quantum yield of between 60% and 99%.

3. The population of nanostructures of claim 1, wherein at least 85% of the nanostructures have a tetrahedral shape.

4. The population of nanostructures of claim 1, wherein the population has a full width at half maximum (FWHM) of between 10 nm and 60 nm.

5. The population of nanostructures of claim 1, wherein the population has a full width at half maximum (FWHM) of between 10 nm and 40 nm.

* * * * *